United States Patent [19]

Moore

[11] Patent Number: 4,541,004

[45] Date of Patent: Sep. 10, 1985

[54] AERODYNAMICALLY ENHANCED HEAT SINK

[75] Inventor: Richard M. Moore, El Cajon, Calif.

[73] Assignee: Burroughs Corporation, Detroit, Mich.

[21] Appl. No.: 444,159

[22] Filed: Nov. 24, 1982

[51] Int. Cl.³ .................. H01L 23/36; H01L 23/14
[52] U.S. Cl. ................................... 357/81; 357/68
[58] Field of Search ............ 357/81; 165/80 B, 80 D, 165/179, 181, 182, 183; 174/16 HS

[56] References Cited

U.S. PATENT DOCUMENTS

| | | | |
|---|---|---|---|
| 2,756,374 | 7/1956 | Colleran et al. | 357/81 |
| 3,421,578 | 1/1969 | Marton | 351/81 |
| 4,103,737 | 8/1978 | Perkins | 357/82 |

FOREIGN PATENT DOCUMENTS 1172471  12/1969  United Kingdom ............. 357/81 C

OTHER PUBLICATIONS

"Thermally Enhanced Multilayer Ceramic Substrate Structure", Kerjilian et al., vol. 18, No. 2-7, 1975, pp. 353-354, IBM Technical Disclosure.
"Semiconductor Package with Improved Cooling", Berndlmaier et al., IBM Tech. Disclosure, pp. 3452-3453, vol. 20, No. 9, Feb. 1978.

Primary Examiner—Andrew J. James
Assistant Examiner—Sheila Y. Clark
Attorney, Agent, or Firm—Charles J. Fassbender; J. Ronald Richbourg; Kevin R. Peterson

[57] ABSTRACT

An aerodynamically enhanced heat sink is disclosed, which heat sink includes a plurality of metallic pins each having one end thereof affixed to the integrated circuit package and the second end thereof being disposed for heat dissipation. The plurality of pins are made of varying lengths such that a partial hemisphere is formed with the second ends thereof.

5 Claims, 3 Drawing Figures

AERODYNAMICALLY ENHANCED HEAT SINK

BACKGROUND OF THE INVENTION

This invention relates to the art of cooling integrated circuit packages, and more particularly to a new and improved aerodynamically-enhanced heat sink.

With the introduction of very large scale integrated (VLSI) devices, heat dissipation has become an ever-increasing problem. The idea of cooling fins for electrical apparatus is quite old, and there are legions of different types of heat sinks that have been used in the past. For the most part, these heat sinks have been employed in larger devices and typically include some form of cooling fins adapted to dissipate heat into the air.

It has been the practice to apply these older heat sink techniques to the newer VLSI circuit packages. However, there are numerous unique problems associated with heat dissipation for integrated circuits that make these older heat sinks unsatisfactory. One such problem is the reduced size of the newer integrated circuit packages vis-a-vis the older electronic apparatus. Another common problem associated with dissipating heat from integrated circuit packages has been growth compatibility with the material of the semiconductor package and that used to make the heat sink.

An integrated circuit is a fragile device fabricated on a silicon substrate. Thus, a suitable heat sink should not cause any warpage of the device or the package housing such device. The warpage problem occasioned by expansion and contraction of a heat sink becomes more acute when used with a brittle package material, such as ceramic which is typically used for housing integrated circuits.

As a general rule, the heat sink is made of metal, such as copper or aluminum. The heat sink is rigidly attached to the semiconductor package by an epoxy or a solder. During this attachment process, the epoxy or solder is heated to a fluid state to effect attachment of the heat sink to the semiconductor package. Thereafter, the epoxy or solder is allowed to cool and harden. This cooling and hardening step also induces stress in the package, and particularly in the material used to attach a lid to the semiconductor package. These stresses vary in magnitude with the overall shape of the particular heat sink that is being attached. And, depending upon the shape of the heat sink, the stresses can become so large as to cause cracks in the lid attach material. When this occurs, the hermetic seal of the integrated circuit is broken which makes the device inoperable.

So long as the heat sink attach material remains liquid, the stresses induced in the lid attach material remain relatively small. However, once the heat sink attach material soldifies, the stresses in the lid attach material rapidly increase. This rapid increase in stress is due to the fact that the heat sink contracts much more rapidly than the ceramic substrate. For example, the coefficients of thermal expansion for copper and aluminum respectively are about 2.6 and 3.6 times the expansion coefficient of ceramic.

For a more detailed analysis of VLSI device heat sinks, their problems and several prior art solutions, reference is made to a technical paper entitled "VLSI Thermal Management in Cost Driven Systems" by T. E. Lewis and D. L. Adams, which was published in the EIA Proceedings, 32nd Electronic Component Conference, 82CH1781-4, May 10 through 12, 1982, at page 166.

BRIEF SUMMARY OF THE INVENTION

Accordingly, an object of this invention is to provide an improved heat sink for an integrated circuit package.

Another object of this invention is to provide a heat sink which reduces the amount of thermal-mechanical stress that is induced in the integrated circuit package when the package and heat sink are rigidly attached and thermally cycled.

A feature of the present invention resides in the provision of a heat sink aerodynamically shaped so as to enhance the convection of heat from the heat sink by means of both laminar and turbulent airflow over the heat sink.

An advantage of this invention is that the plurality of pins of this heat sink increase the effective cooling area many times over that of heat sinks formed of multiple cooling fins.

Another advantage of this invention is that the partial hemispherical profile of the heat sinking pin tips provides an omnidirectional heat sink.

In one embodiment of this invention, a heat sink is provided for cooling an integrated circuit package which heat sink comprises a pluarlity of pins each having one end thereof affixed to the integrated circuit package and the second end thereof being disposed for heat dissipation. The plurality of pins are made of varying lengths such that a partial hemispherical shape is formed with the second ends thereof.

BRIEF DESCRIPTION OF THE DRAWINGS

Various features and advantages of the invention are described in the Detailed Description in conjunction with the accompanying drawings wherein.

DETAILED DESCRIPTION OF THE INVENTION

Figure 1:
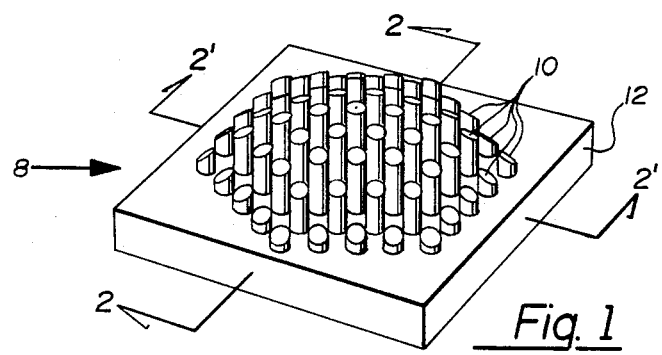
FIG. 1 is a perspective view of the heat sink in accordance with one embodiment of this invention.
Figure 2:
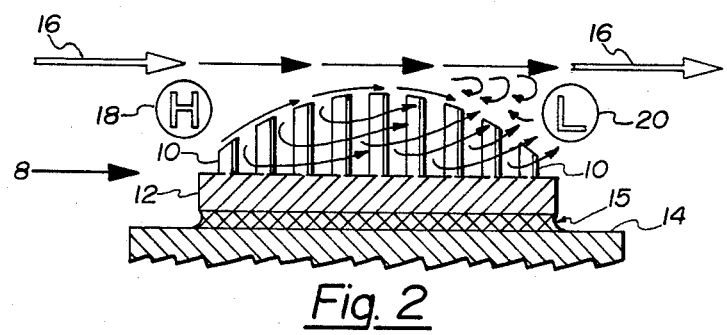
FIG. 2 is a cross section of another embodiment of this invention.

Referring now to FIG. 1, the heat sink 8 of this invention is shown in a perspective view. More particularly, the heat sink 8 includes a multiplicity of pins 10 attached to a semiconductor device package 12. Each of the pins 10 are precut to size so as to form an airfoil having a shape generally approaching a partial hemisphere. FIGS. 1 and 2 show this partial hemispherical shape; and as is there shown, it is formed by a plane which passes through part of a hemisphere. The ends of the pins are also contoured to the partial hemispherical shape, which will amplify turbulent flow eddy currents as will be explained further hereinbelow. The pins are preferably made of copper (e.g., CDA110) or aluminum. When air is moved across the heat sink, a high pressure area is formed on the windward side of the heat sink and a low pressure area is formed on the leeward side thereof. This phenomenon is based on the well-known venturi principle.

The aerodynamic characteristics of the heat sink of this invention are better illustrated in FIG. 2 wherein another embodiment of the heat sink 8 is formed by setting the pins 10 into a substrate 14, which is affixed to the semiconductor device package 12 by means of a die-attach 15. The direction of airflow over the heat sink 8 is generally indicated by an arrow 16; and, as a result of such airflow, high pressure area 18 is formed on the windward side of the heat sink and a low pressure area 20 is formed on the leeward side. The low pressure area 20 will act to pull hot air out from around the pins 10 as indicated by the arrows in FIG. 2.

The pins 10 can either be brazed directly to the back of the semiconductor package 12 as illustrated in FIG. 1, or they can be set in the substrate 14, as illustrated in FIG. 2. When the pins 10 are set into a separate substrate (e.g., substrate 14), the substrate is epoxy-attached to the semiconductor package. If the pins 10 are brazed directly to the package 12, then thermal growth will be greatly minimized. Moreover, the direct brazed embodiment of FIG. 1 is simpler in design and presents a lower package-heat sink profile that results in a higher density, smaller geometry system.

On the other hand, if the pins are attached to the substrate 14, a material should be selected for the substrate that matches the thermal growth of the package so that both the substrate and the package grow at the same rate with enough elasticity to account for pin growth. For example, if the package 12 is made of ceramic, the substrate should preferably be made of ceramic also. To this end, the pins 10 are encapsulated in the ceramic substrate 14 which is attached to the package 12 by thermally conductive epoxy 15. Hence, this embodiment is easier to manufacture.

Figure 3:
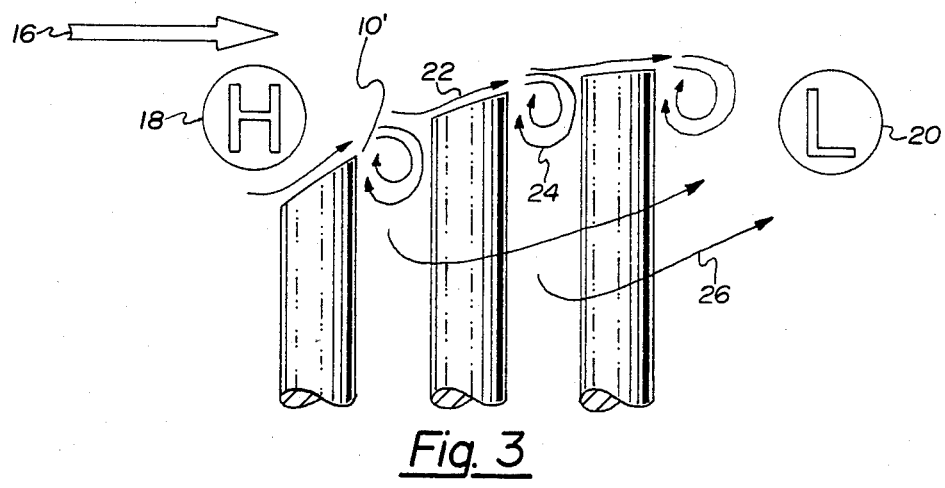
FIG. 3 is a detail drawing that shows the laminar flow of air across and through the pins of the heat sink.

The detail in FIG. 3 illustrates three different air movement components resulting from the general air movement represented by arrow 16. First, there is the surface laminar flow indicated by arrows 22 which moves across the surface of the tips of the pins. This air movement removes the hot air dissipated at the tips of the pins. As a product of the laminar air flow, turbulent flow eddy currents represented by arrows 24 are formed at the trailing edge 10' of the pins 10. The eddy currents, in combination with a third air movement caused by a pulling action by the low pressure area 20 (indicated by the arrows 26), remove hot air that is being dissipated by the pins 10.

It may be appreciated from the discussion hereinabove that an aerodynamically enhanced heat sink has been described in detail. Thus, while the invention has been particularly shown and described with reference to one embodiment, it will be understood by those skilled in the art that foregoing and other changes in form and detail may be made without departing from the spirit and scope of the invention. Accordingly, it is intended that the present invention only be limited in scope by the appended claims.

I claim:

1. A heat sink for cooling an integrated circuit package, said heat sink comprising:
    a plurality of metallic pins each having one end thereof attached to the integrated circuit package and the second end thereof being disposed for heat dissipation, said plurality of pins being of varying lengths such that a partial hemisphere is formed with the second ends thereof.

2. A heat sink as in claim 1 further characterized by said integrated circuit package being made of ceramic.

3. A heat sink as in claim 2 further characterized by said plurality of metallic pins each having said one end thereof embedded in a ceramic substrate.

4. A heat sink as in claim 1 further characterized by said metallic pins being formed of aluminum.

5. A heat sink as in claim 1 further characterized by said metallic pins being formed of copper.

* * * * *